United States Patent
Suzuki et al.

(10) Patent No.: US 8,669,183 B2
(45) Date of Patent: Mar. 11, 2014

(54) MANUFACTURING METHOD OF SEMICONDUCTOR DEVICE

(75) Inventors: Akira Suzuki, Gunma (JP); Katsuyuki Seki, Gunma (JP); Koujiro Kameyama, Gunma (JP); Takahiro Oikawa, Gunma (JP)

(73) Assignees: SANYO Semiconductor Manufacturing Co., Ltd., Ojiya-shi (JP); Semiconductor Components Industries, LLC, Phoenix, AZ (US)

(*) Notice: Subject to any disclaimer, the term of this patent is extended or adjusted under 35 U.S.C. 154(b) by 907 days.

(21) Appl. No.: 11/802,107

(22) Filed: May 18, 2007

(65) Prior Publication Data

US 2007/0281474 A1 Dec. 6, 2007

(30) Foreign Application Priority Data

May 19, 2006 (JP) .................... 2006-139693

(51) Int. Cl.
*H01L 21/302* (2006.01)

(52) U.S. Cl.
USPC ........... 438/689; 438/675; 438/677; 438/710; 438/714

(58) Field of Classification Search
USPC .......................................................... 438/689
See application file for complete search history.

(56) References Cited

U.S. PATENT DOCUMENTS

| | | | | |
|---|---|---|---|---|
| 4,729,815 A * | 3/1988 | Leung | | 438/714 |
| 6,071,822 A * | 6/2000 | Donohue et al. | | 438/712 |
| 6,265,950 B1 * | 7/2001 | Schmidt et al. | | 333/26 |
| 6,586,315 B1 * | 7/2003 | Dewa | | 438/464 |
| 6,630,407 B2 * | 10/2003 | Keil et al. | | 438/717 |
| 6,660,642 B2 * | 12/2003 | Zheng et al. | | 438/700 |
| 6,759,340 B2 * | 7/2004 | Nallan et al. | | 438/714 |
| 6,821,901 B2 * | 11/2004 | Song et al. | | 438/700 |
| 6,846,746 B2 * | 1/2005 | Rattner et al. | | 438/706 |
| 6,924,235 B2 * | 8/2005 | Johnson et al. | | 438/689 |
| 7,045,466 B2 * | 5/2006 | Subramanian et al. | | 438/712 |
| 7,067,435 B2 * | 6/2006 | Dostalik | | 438/740 |
| 7,071,554 B2 * | 7/2006 | Hussein et al. | | 257/737 |
| 7,081,407 B2 * | 7/2006 | Annapragada et al. | | 438/624 |
| 7,124,994 B2 * | 10/2006 | Morales | | 249/61 |

(Continued)

FOREIGN PATENT DOCUMENTS

| CN | 1658385 A | 8/2005 |
|---|---|---|
| EP | 1 376 678 | 1/2004 |

(Continued)

OTHER PUBLICATIONS

European Search Report mailed on Mar. 29, 2010, directed to counterpart European Patent Application No. 07010073.0; 7 pages.

*Primary Examiner* — Alexander Sofocleous
*Assistant Examiner* — Ankush Singal
(74) *Attorney, Agent, or Firm* — Morrison & Foerster LLP (57) ABSTRACT

This invention is directed to form a homogeneous film in a via hole formed in a semiconductor device using Bosch process. The via hole that penetrates through a predetermined region in a semiconductor substrate is formed by etching the semiconductor substrate from one of its surface to the other by the Bosch process using a mask layer as a mask. Next, the mask layer is removed. Then, scallops are removed by dry etching to flatten a sidewall of the via hole. Following the above, an insulation film, a barrier layer and the like are formed homogeneously in the via hole.

6 Claims, 8 Drawing Sheets

(56) References Cited

U.S. PATENT DOCUMENTS

| | | | |
|---|---|---|---|
| 7,141,504 B1* | 11/2006 | Bhardwaj | 438/700 |
| 7,220,678 B2 | 5/2007 | Nozawa et al. | |
| 7,241,683 B2* | 7/2007 | Hudson et al. | 438/637 |
| 7,256,497 B2 | 8/2007 | Kameyama et al. | |
| 7,425,507 B2* | 9/2008 | Lake | 438/694 |
| 7,687,916 B2* | 3/2010 | Lake | 257/773 |
| 7,759,247 B2* | 7/2010 | Kameyama et al. | 438/666 |
| 7,829,243 B2* | 11/2010 | Chen et al. | 430/5 |
| 2002/0037624 A1* | 3/2002 | Mori et al. | 438/396 |
| 2002/0055265 A1* | 5/2002 | Ring | 438/714 |
| 2002/0158047 A1* | 10/2002 | Wang | 216/24 |
| 2003/0000919 A1* | 1/2003 | Velebir, Jr. | 216/24 |
| 2003/0137056 A1* | 7/2003 | Taniguchi et al. | 257/774 |
| 2003/0211752 A1 | 11/2003 | Rattner et al. | |
| 2003/0211753 A1 | 11/2003 | Nallan et al. | |
| 2003/0219948 A1 | 11/2003 | Kuribayashi | |
| 2004/0043615 A1* | 3/2004 | Yamamoto et al. | 438/689 |
| 2004/0082164 A1* | 4/2004 | Chen et al. | 438/633 |
| 2004/0097077 A1* | 5/2004 | Nallan et al. | 438/689 |
| 2004/0161930 A1* | 8/2004 | Ma et al. | 438/689 |
| 2004/0232106 A1* | 11/2004 | Oka et al. | 216/26 |
| 2005/0003649 A1* | 1/2005 | Takao | 438/612 |
| 2005/0056941 A1* | 3/2005 | Vanhaelemeersch et al. | 257/773 |
| 2005/0095806 A1* | 5/2005 | Nevin et al. | 438/424 |
| 2005/0112884 A1 | 5/2005 | Gormley | |
| 2005/0139542 A1 | 6/2005 | Dickensheets et al. | |
| 2005/0155951 A1* | 7/2005 | Suzuki et al. | 216/66 |
| 2005/0164514 A1* | 7/2005 | Rauf et al. | 438/710 |
| 2005/0189637 A1* | 9/2005 | Okayama et al. | 257/679 |
| 2005/0196957 A1* | 9/2005 | Kameyama et al. | 438/637 |
| 2005/0208766 A1* | 9/2005 | Kirby et al. | 438/667 |
| 2005/0233582 A1* | 10/2005 | Friedemann et al. | 438/672 |
| 2005/0269696 A1* | 12/2005 | Ochiai | 257/734 |
| 2006/0001147 A1 | 1/2006 | Tomita et al. | |
| 2006/0024966 A1* | 2/2006 | Umemoto et al. | 438/689 |
| 2006/0033168 A1* | 2/2006 | Umemoto et al. | 257/379 |
| 2006/0098050 A1* | 5/2006 | Terui | 347/61 |
| 2006/0108691 A1* | 5/2006 | Kameyama et al. | 257/758 |
| 2006/0292877 A1* | 12/2006 | Lake | 438/694 |
| 2007/0177287 A1* | 8/2007 | Oka et al. | 359/872 |
| 2007/0212888 A1 | 9/2007 | Kasai et al. | |
| 2008/0121611 A1* | 5/2008 | Miller et al. | 216/13 |
| 2009/0252938 A1* | 10/2009 | Baik et al. | 428/209 |
| 2009/0274418 A1* | 11/2009 | Holzwarth et al. | 385/30 |
| 2010/0102838 A1* | 4/2010 | Kitazume et al. | 324/754 |

FOREIGN PATENT DOCUMENTS

| | | |
|---|---|---|
| EP | 1 653 508 | 5/2006 |
| EP | 1 884 989 | 2/2008 |
| JP | 3-11629 | 1/1991 |
| JP | 10-041389 | 2/1998 |
| JP | 2004-296474 | 10/2004 |
| JP | 2005-276877 | 10/2005 |
| JP | 2006-12889 | 1/2006 |
| KR | 10-2007-0047016 A | 5/2007 |
| WO | WO-03/030239 | 4/2003 |

* cited by examiner

MANUFACTURING METHOD OF SEMICONDUCTOR DEVICE

CROSS-REFERENCE OF THE INVENTION

This application claims priority from Japanese Patent Application No. 2006-139693, the content of which is incorporated herein by reference in its entirety.

BACKGROUND OF THE INVENTION

1. Field of the Invention

This invention relates to a manufacturing method of a semiconductor device, specifically to a manufacturing method of a semiconductor device having an opening in a semiconductor substrate.

2. Description of the Related Art

It is known that a via hole (opening) is formed to penetrate through a semiconductor substrate from one of principal surfaces of the semiconductor substrate to the other and a conductive material (metal such as aluminum, copper, tungsten and titanium tungsten) serving as a wiring is formed in the via hole so that conductors disposed on both of the principal surfaces are electrically connect with each other.

Bosch process has been known as one of methods to form the via hole. The Bosch process is used to produce a deep vertical trench in the semiconductor substrate and consists of two periodically alternating processes, which are a plasma etch process in which a surface of the semiconductor substrate is plasma etched isotropically using a $SF_6$ gas and a plasma deposition process in which carbon polymers are deposited as a protection film using a $C_4F_8$ gas on a sidewall of the trench formed by the plasma etch process.

Figure 14:
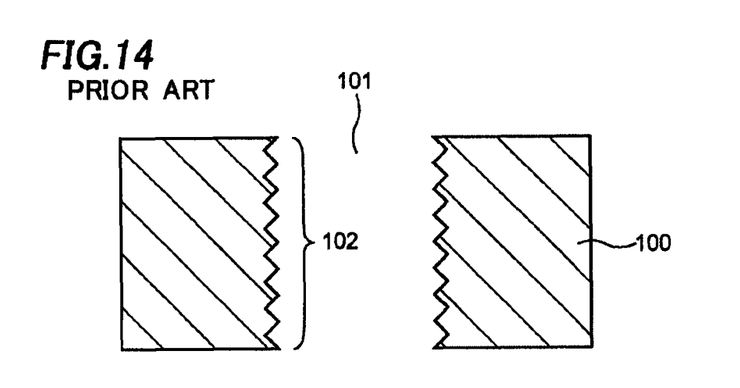
FIG. 14 is a cross-sectional view showing a manufacturing method of a semiconductor device according to a conventional art.

When the plasma etch process is performed by the Bosch process, a via hole 101 is formed to penetrate a semiconductor substrate 100, as shown in FIG. 14. It is known, however, that rough shapes (hereafter referred to as scallops 102) are caused on a surface of a sidewall of the via hole 101 at the same time. The scallops 102 result from the isotropic etching in the plasma etch process.

The technology mentioned above is described in Japanese Patent Application Publication No. 2006-12889, for example.

When the surface of the sidewall of the via hole 101 is turned to the scallops 102, it is difficult to form a desired film (an insulation film or a barrier layer, for example) homogeneously on the sidewall of the via hole 101, thereby causing a problem that is reduction in yield and reliability of the semiconductor device.

Figure 15A:
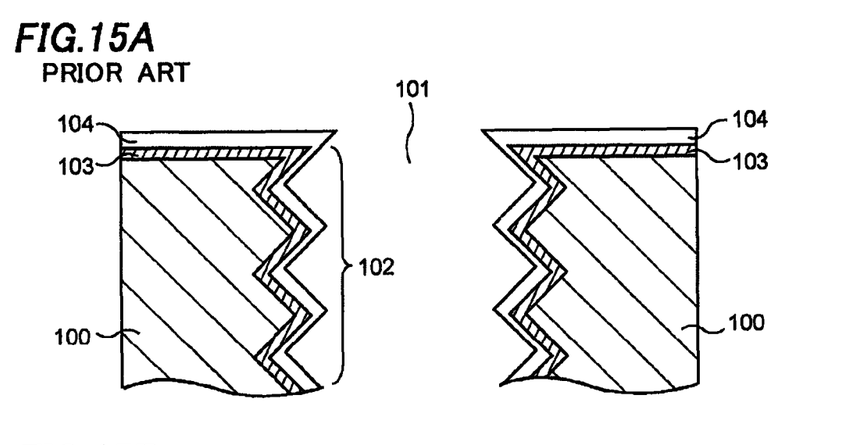
FIGS. 15A and 15B are cross-sectional views showing the manufacturing method of the semiconductor device according to the conventional art.

To describe concretely, when an insulation film 103 is formed on the sidewall of the via hole 101 and a barrier layer 104 (a titanium layer, a titanium-tungsten layer, a tantalum layer or a tantalum nitride layer, for example) or a conductive material serving as a wiring is to be deposited on the insulation film 103 by sputtering as shown in FIG. 15A, for example, there has been a region to which sputtered particles do not reach sufficiently because of the scallops 102, thereby making the sputtered layer uneven in thickness and insufficient in coverage. Particularly when an aspect ratio (height/aperture diameter) of the via hole 101 is high, forming a homogeneous film becomes even more difficult, resulting in reduced functionality of the barrier layer 104 and the wiring.

Similarly, when the barrier layer 104 or the conductive material serving as the wiring is formed by CVD (Chemical Vapor Deposition), a reaction gas does not reach evenly to the sidewall of the via hole 101 because of the scallops 102, and there has been a region where the layer deposited by CVD becomes insufficient in coverage.

In addition, there is a case in which the film is formed thicker than usually required in order to avoid the insufficient coverage, which causes problems of reduced productivity and an excessive thickness of the film in a specific region.

Figure 15B:
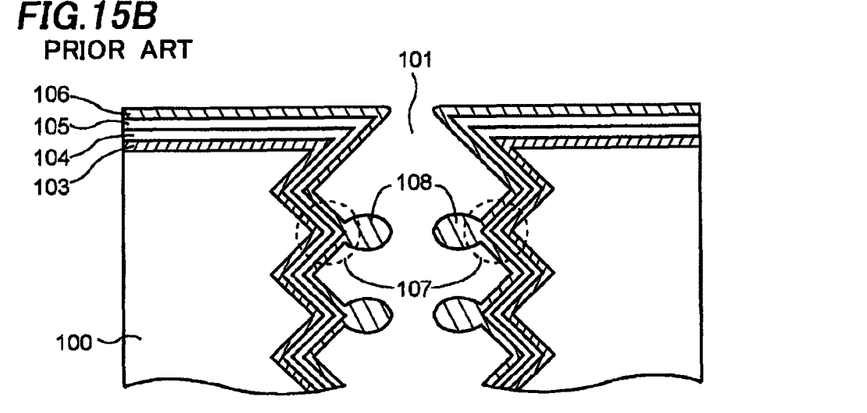

Also, the scallops 102 have sharp edges which are to be reflected in a film formed in the via hole 101 in a later process step. As a result, when the insulation film 103, the barrier layer 104 and a seed layer 105 that serves as a plating electrode are formed consecutively in the via hole 101 and a through-hole electrode 106 is formed in the via hole 101 by plating as shown in FIG. 15B, electric charge convergence is caused at the sharp edges 107 of the seed layer 105 in the plating process. Then a material (copper or aluminum, for example) forming the through-hole electrode 106 grows abnormally at the sharp edges 107 to form abnormally grown portions 108 as shown in FIG. 15B. Since the abnormally grown portions 108 touch the material forming the through-hole electrode 106 on the opposite side when they grow further, appropriate plating is not performed and there are caused problems that the through-hole electrode 106 is disconnected and a void is caused in the through-hole electrode 106.

Reducing etch rate in the Bosch process could suppress generation of the scallops 102. However, it causes a problem of reduced productivity.

This invention is directed to offer a manufacturing method of a semiconductor device, which makes it possible even when the scallops are caused in the process to form the via hole using the Bosch process that practically homogeneous films are formed in the via hole in later process steps.

SUMMARY OF THE INVENTION

This invention is directed to solve the problems addressed above and has following features. This invention offers a method of manufacturing a semiconductor device including a plasma etch process to form a groove in a semiconductor substrate, a plasma deposition process to deposit a protection film on a sidewall of the groove, a process to form an opening in the semiconductor substrate by alternating the plasma etch process and the plasma deposition process and a process to flatten a sidewall of the opening in the semiconductor substrate.

This invention also offers a method of manufacturing a semiconductor device including providing a semiconductor substrate having a pad electrode formed on one of principal surfaces of the semiconductor substrate through an insulation film, a process to form a mask layer on another of the principal surfaces of the semiconductor substrate having an opening at a location corresponding to the pad electrode, a plasma etch process to form a groove in the semiconductor substrate using the mask layer as a mask, a plasma deposition process to deposit a protection film on a sidewall of the groove, a process to form an opening reaching the insulation film in the semiconductor substrate by alternating the plasma etch process and the plasma deposition process and a process to flatten a sidewall of the opening in the semiconductor substrate.

This invention also offers the manufacturing method of the semiconductor device further including a process to remove the mask layer and a process to remove the insulation film to expose the pad electrode at a bottom of the via hole, wherein the process to remove the mask layer, the process to remove the insulation film and the process to flatten the sidewall of the opening in the semiconductor substrate are performed simultaneously.

DETAILED DESCRIPTION OF THE INVENTION

Embodiments of this invention will be explained hereinafter, referring to the drawings. FIGS. 1 through 3B are cross-sectional views showing a manufacturing method of a semiconductor device according to a first embodiment of this invention.

Figure 1:
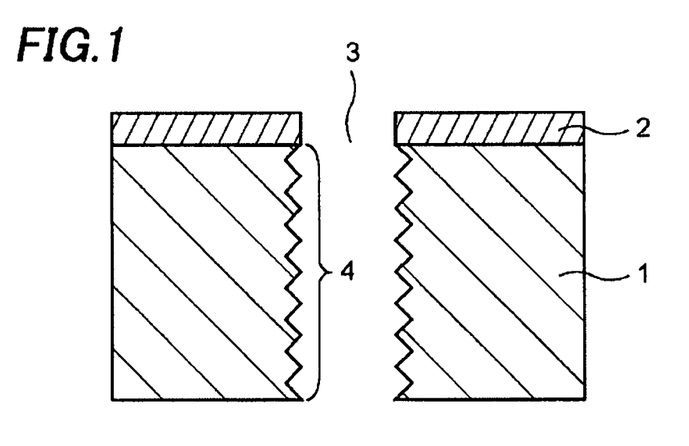
FIG. 1 is a cross-sectional view showing a manufacturing method of a semiconductor device according a first embodiment of this invention.

First, a semiconductor substrate 1, on a surface of which an electronic device (not shown) is formed, is provided as shown in FIG. 1. Next, a mask layer 2 is selectively formed on a back surface of the semiconductor substrate 1. The mask layer 2 is used as a mask to form a via hole 3 and its material is not limited to a particular material as long as it functions for that purpose. The mask layer 2 may be an insulation film such as a silicon oxide film and a silicon nitride film or a photoresist layer.

Next, a predetermined region in the semiconductor substrate 1 is etched by the Bosch process using the mask layer 2 as a mask. To describe concretely, the etching is performed using a BM2304 type ICP (Inductively Coupled Plasma) etcher by alternating a plasma etch process at a pressure of 50-60 mTorr, a $SF_6$ gas flow rate of 400-450 scc/min, an $O_2$ gas flow rate of 35-40 scc/min and an ICP power of 1500-2000 W for 10 seconds and a plasma deposition process at a pressure of 20-30 mTorr, a $C_4F_8$ gas flow rate of 150-200 scc/min and an ICP power of 1200-1700 W for 5 seconds.

While the via hole (opening) 3 penetrating through a thickness of the semiconductor substrate 1 is formed by the Bosch process, a surface of a sidewall of the via hole 3 is shaped into scallops 4, as shown in FIG. 1. A depth of the via hole 3 is about 100-150 μm, for example, and a step height of the scallops 4 is about 6000 Å, for example. The step height of the scallops 4 becomes larger as an amount of side etching in a lateral direction by the $SF_6$ gas increases.

The shape of the scallops 4 in the figure is considerably exaggerated for the sake of viewing convenience and does not reflect the real dimension. The closer to a bottom of the via hole 3 (lower side in FIG. 1) a location is, the lower an etch rate of the plasma etch at the location is. Therefore, the step height of the scallops 4 is smaller and closer to flat at a location closer to the bottom of the via hole 3 than that at a location in upper side of the via hole 3 (upper side in FIG. 1). The via hole 3 is shown to have a straight shape in FIG. 1. However, the actual via hole 3 formed by the Bosch process tends to be tapered down, that is, a diameter of the opening reduces as the depth of the via hole 3 becomes greater.

Next, the mask layer 2 is removed. To describe concretely, when the mask layer 2 is a photoresist layer, it is removed by $O_2$ plasma ashing using photoresist removal equipment such as a plasma asher. When the mask layer 2 is an insulation film such as a silicon oxide film, it is removed using a parallel plate plasma etcher or a reactive ion etcher.

Figure 2:
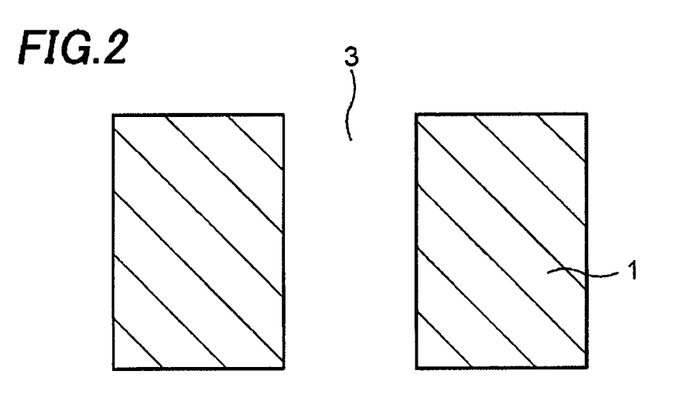
FIG. 2 is a cross-sectional view showing the manufacturing method of the semiconductor device according the first embodiment of this invention.

Then the scallops 4 are removed by dry etching to flatten (i.e., to smooth) the sidewall of the via hole 3, as shown in FIG. 2. The dry etching is an etching method using ions and radicals generated in plasma that is generated in a chamber of the equipment. The dry etching includes plasma etching, reactive ion etching, chemical dry etching and the like.

It is performed using a parallel plate plasma etcher, for example. The scallops 4 were reduced by executing the flattening process at a pressure of 50-150 mTorr, a $CF_4$ gas flow rate of 50-100 scc/min, a $CHF_3$ gas flow rate of 0-25 scc/min and a power of 400-800 W. Performing the etching under the conditions of lower pressure, higher power and richer $CF_4$ gas is preferable from a standpoint of enhancing an effect of improving the scallops 4, that is, making the sidewall of the via hole 3 flatter.

Then an insulation film, a barrier layer, a seed layer and a through-hole electrode are formed on the flattened sidewall of the via hole 3, making it possible to electrically connect one of principal surfaces of the semiconductor substrate 1 with the other. Detailed manufacturing processes after the flattening process will be described in explanation of a second embodiment.

The scallops 4 on the sidewall of the via hole 3 are improved in this embodiment. As a result, it is made possible to form a highly homogeneous film in the via hole 3 in later process steps. In a sputtering process, for example, homogenizing a deposited amount of sputtered particles onto the sidewall of the via hole 3 can be facilitated. Also, in the case of CVD, a reaction gas reaches the sidewall evenly, making it possible to prevent insufficient coverage.

In addition, excessive film forming is no longer needed because possibility of insufficient coverage due to the scallops 4 has been eliminated. Thus the productivity is improved and a thickness of the film formed in the via hole 3 can be reduced.

The scallops 4 do not affect film forming in later process steps, and electric charges do not converge in a plating process. As a result, highly reliable plating is made possible. Since all films formed on the sidewall of the via hole 3 are formed favorably, the reliability and the yield are improved compared with the conventional semiconductor device.

Figure 3A:
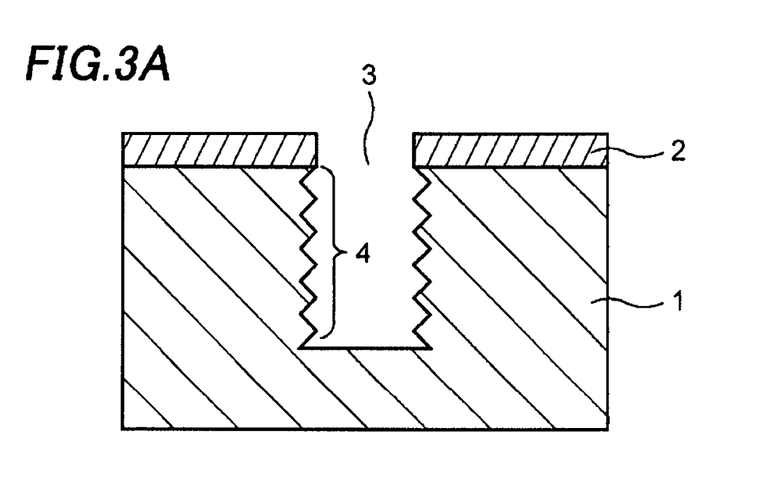
FIGS. 3A and 3B are cross-sectional views showing the manufacturing method of the semiconductor device according the first embodiment of this invention.
Figure 3B:
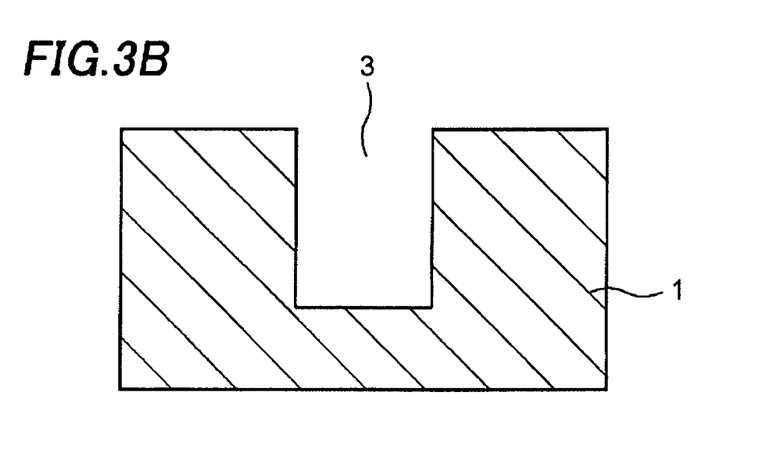

Although the via hole 3 described above penetrates through the semiconductor substrate 1, the via hole 3 does not necessarily penetrate through the substrate 1 and its bottom may be located in the middle of the semiconductor substrate 1. Therefore, it is possible that the via hole 3 is formed partway in the semiconductor substrate 1 using the Bosch process as shown in FIG. 3A, and then the scallops 4 are improved as shown in FIG. 3B.

Next, a manufacturing process of a semiconductor device according to the second embodiment of this invention will be explained referring to the drawings. FIGS. 4 through 13 are cross-sectional views showing the semiconductor device in a sequence of manufacturing process steps. Explanation on the same structure as in the first embodiment is omitted or simplified. Although the manufacturing process is applied to a wafer in which a plurality of the semiconductor devices is arrayed in a matrix bordered with predetermined dicing lines, only one of the semiconductor devices is described hereafter for the simplicity of explanation.

Figure 4:
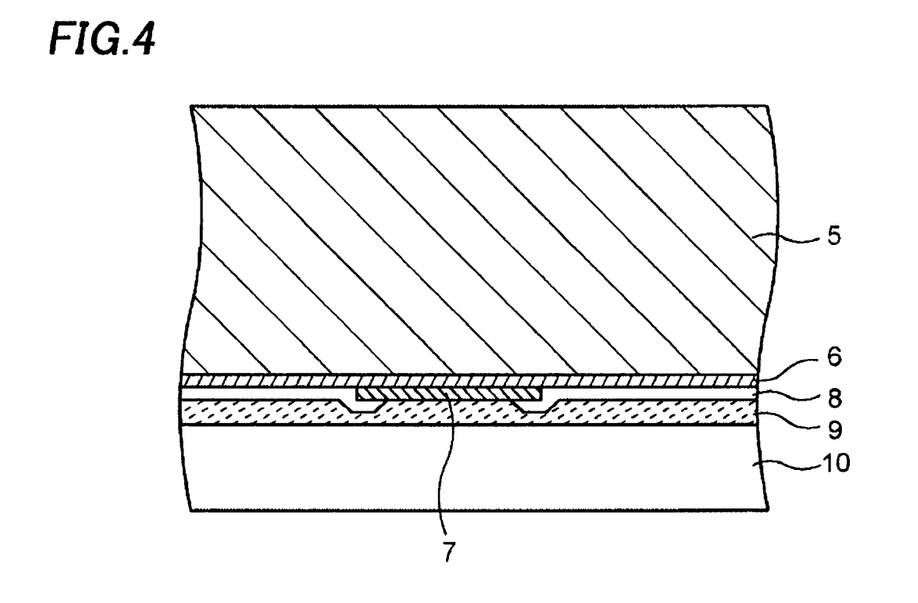
FIG. 4 is a cross-sectional view showing a manufacturing method of a semiconductor device according a second embodiment of this invention.

First, as shown in FIG. 4, there is provided a semiconductor substrate 5, in a top surface of which an electronic device (a CCD, a light-receiving device such as a CCD and an infrared sensor, a light-emitting device or other semiconductor device, for example) is formed. The semiconductor substrate 5 is 8 inches (200 mm) in diameter and 300-700 μm in thickness, for example. A first insulation film 6 (a silicon oxide film or a BPSG (Boro-Phospho Silicate Glass) film formed by thermal oxidation or CVD, for example) of a thickness of 2 μm, for example, is formed on the top surface of the semiconductor substrate 5.

A metal layer such as aluminum (Al), aluminum alloy, copper (Cu) or the like is formed by sputtering, plating or other film forming method. After that, patterning is performed by etching the metal layer using a photoresist layer (not shown) as a mask. With this, a pad electrode 7 of a thickness of 1 μm, for example, is formed on the first insulation film 6. The pad electrode 7 is electrically connected with the electronic device and its peripheral element on the semiconductor substrate 5 through a wiring (not shown).

Next, a passivation film 8 (a silicon nitride film, for example) that covers a portion of the pad electrode 7 on the top surface of the semiconductor substrate 5 is formed by CVD, for example. Next, a supporter 10 is bonded to the top surface of the semiconductor substrate 5 including the pad electrode 7 through an adhesive layer 9 made of an epoxy resin, resist, acryl or the like. The supporter 10 may be a film-shaped protection tape, may be a rigid substrate made of a glass, quartz, ceramics, plastics, a metal or the like, or may be made of a resin. It is preferable that the supporter 10 is a rigid substrate in order to firmly support the semiconductor substrate 5 of reducing thickness and to accommodate hands-free automatic transfer. The supporter 10 serves to support the semiconductor substrate 5 as well as protecting a surface of the device.

Next, back grinding by a back surface grinder is applied to a back surface of the semiconductor substrate 5 to reduce the thickness of the semiconductor substrate 5 down to a predetermined thickness (about 100-150 μm, for example). The back grinding may be replaced with etching, or a combination of grinding and etching. The back grinding might not be necessary, depending on usage or specifications of the final product or an initial thickness of the semiconductor substrate 5 being provided.

Figure 5:
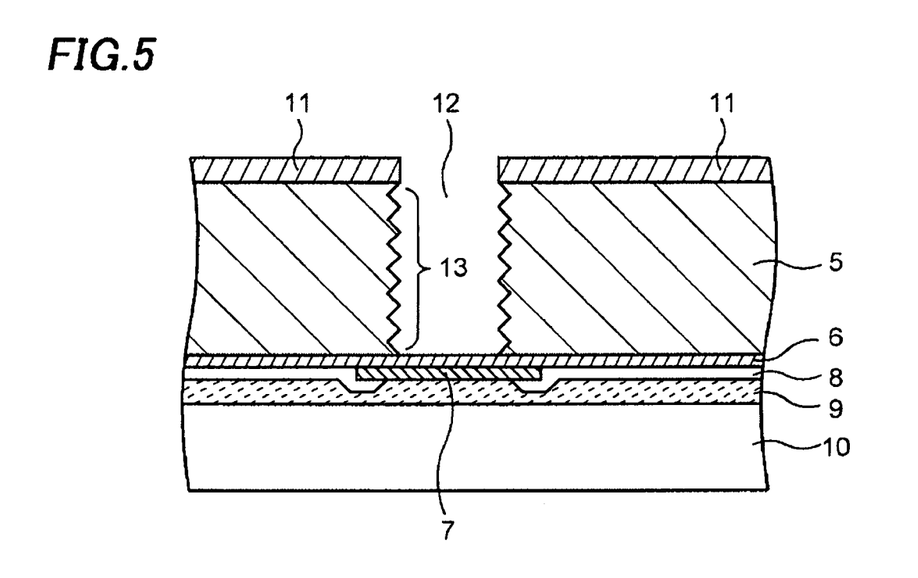
FIG. 5 is a cross-sectional view showing the manufacturing method of the semiconductor device according the second embodiment of this invention.

Next, a mask layer 11 is selectively formed on the back surface of the semiconductor substrate 5, as shown in FIG. 5. The mask layer 11 has an opening at a location on the back surface of the semiconductor substrate 5 corresponding to the pad electrode 7. The mask layer 11 may be an insulation film such as a silicon oxide film and a silicon nitride film, or a photoresist layer, as in the first embodiment.

Next, a predetermined region in the semiconductor substrate 5 is etched by the Bosch process using the mask layer 11 as a mask. Concrete processing conditions of the Bosch process are the same as those in the first embodiment.

While a via hole 12 (an opening) that penetrates through the semiconductor substrate 5 from the back surface to the top surface and exposes a portion of the first insulation film 6 is formed by the Bosch process, a sidewall of the via hole 12 is shaped into scallops 13. A diameter of the via hole 12 is about 30-50 μm, and a depth of it is about 100-150 μm, for example.

Next, the mask layer 11 is removed. To describe concretely, when the mask layer 2 is the photoresist layer, it is removed by $O_2$ plasma ashing, for example, using photoresist removal equipment such as a plasma asher. When the mask layer 11 is the insulation film such as the silicon oxide film, it is removed using a parallel plate plasma etcher or a reactive ion etcher.

Figure 6:
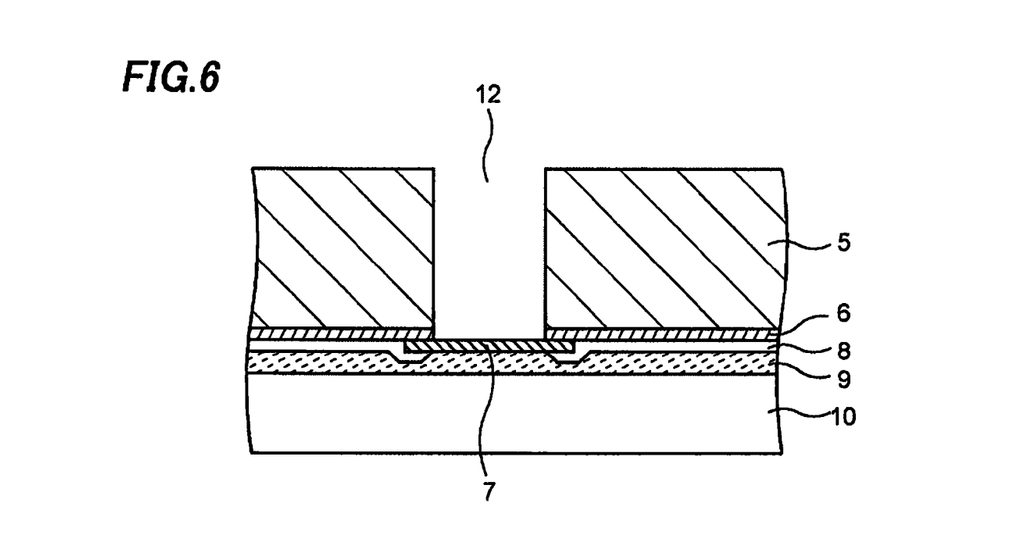
FIG. 6 is a cross-sectional view showing the manufacturing method of the semiconductor device according the second embodiment of this invention.
Figure 7:
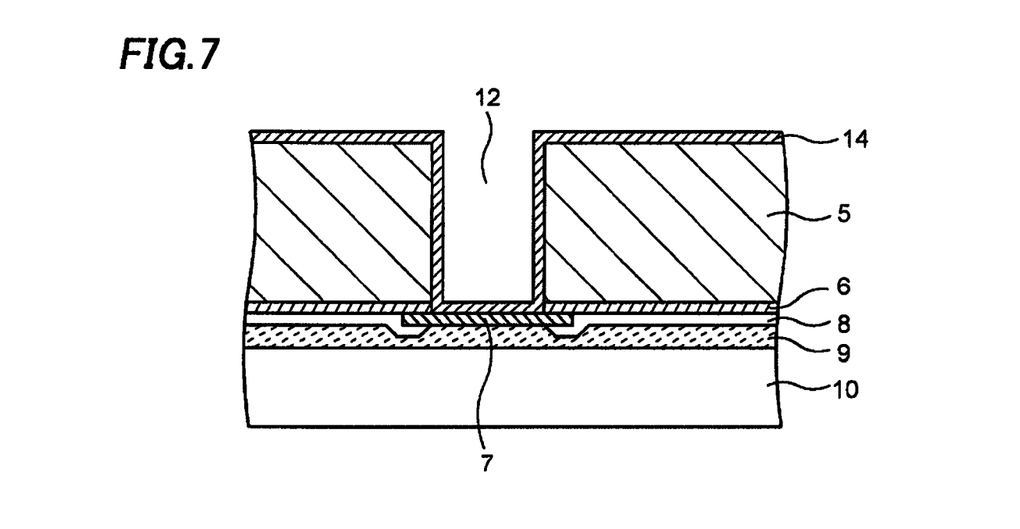
FIG. 7 is a cross-sectional view showing the manufacturing method of the semiconductor device according the second embodiment of this invention.

Then the scallops 13 are removed by dry etching to flatten the sidewall of the via hole 12, as shown in FIG. 6. Examples of concrete processing conditions and equipment used in the process are the same as those in the first embodiment. Then the portion of the first insulation film 6 exposed in the via hole 12 is removed to expose the pad electrode 7.

Note that removing the portion of the first insulation film 6 can be performed at the same time as flattening the sidewall of the vial hole 12, using the same etching equipment. Furthermore, when the mask layer 11 is the insulation film such as the silicon oxide film, it is preferable that removing the mask layer 11, flattening the sidewall of the via hole 12 and removing the portion of the first insulation film 6 are performed simultaneously using the same equipment.

Next, a second insulation film 14 (a silicon oxide film or a silicon nitride film formed by CVD, for example) is formed over the entire back surface of the semiconductor substrate 5 including the sidewall of the via hole 12. The second insulation film 14 serves to isolate the semiconductor substrate 5 from conductive materials (a barrier layer 15, a seed layer 16, a through-hole electrode 17 and a wiring layer 18, that are to be described below).

Figure 8:
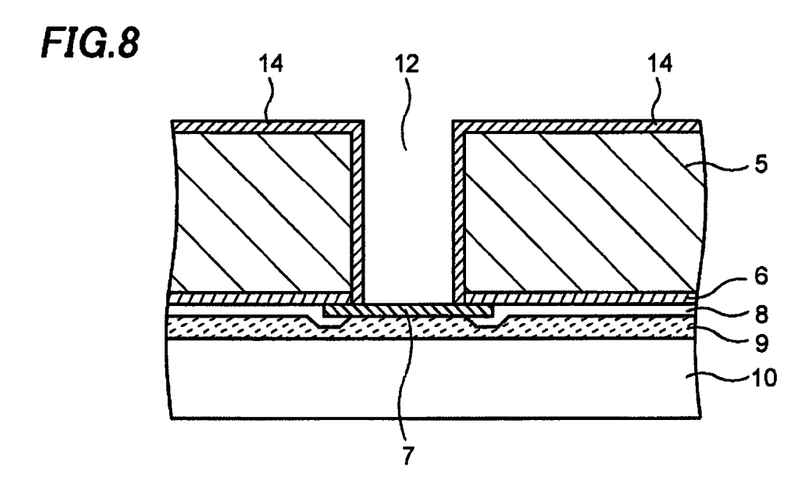
FIG. 8 is a cross-sectional view showing the manufacturing method of the semiconductor device according the second embodiment of this invention.

Next, the second insulation film 14 in the bottom of the via hole 12 is removed by etching using a photoresist layer (not shown) as a mask, as shown in FIG. 8. A portion of the pad electrode 7 is exposed by the etching. The etching may be performed without the mask taking advantage of a varying thickness of the second insulation film 14, the thickness of which is greater on the back surface of the semiconductor substrate 5, reduces on the sidewall and further reduces toward the bottom of the via hole 12. The manufacturing process is optimized by not using the mask in the etching. Also, the first insulation film 6 and the second insulation film 14 may be removed in the same etching process.

Figure 9:
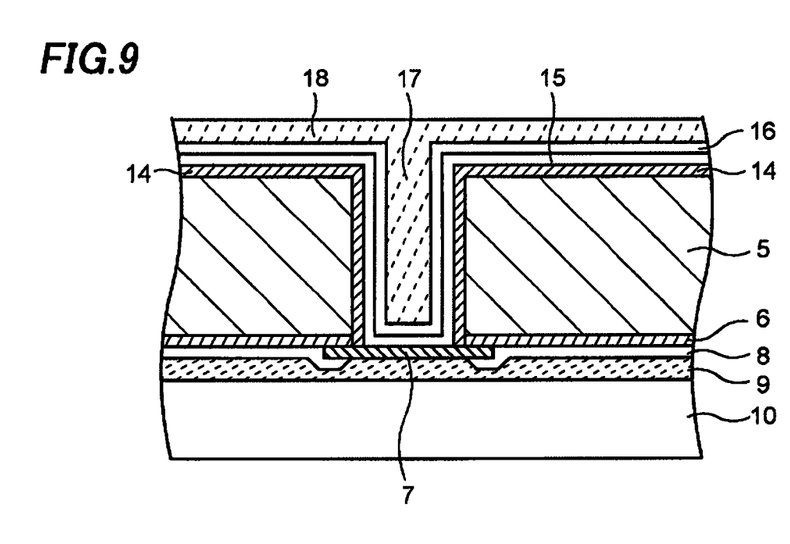
FIG. 9 is a cross-sectional view showing the manufacturing method of the semiconductor device according the second embodiment of this invention.

Next, the barrier layer 15 is formed on the sidewall of the via hole 12 and the back surface of the semiconductor substrate 5, as shown in FIG. 9. The barrier layer 15 is formed by sputtering, PVD (Physical Vapor Deposition), CVD or other film forming method. The barrier layer 15 is composed of a titanium (Ti) layer, a titanium nitride (TiN) layer, a tantalum (Ta) layer, a tantalum nitride (TaN) layer, a titanium tungsten (TiW) layer, a tungsten nitride (WN) layer, a zirconium (Zr) layer, a zirconium nitride (ZrN) layer or the like. The barrier layer 15 serves to prevent diffusion of metallic material composing the through-hole electrode 17 to be formed in the via hole 12, to prevent inter reaction between the metallic material and an underlying conductor (the pad electrode 7 in this embodiment), and to improve adhesion of the through-hole electrode 17 to the semiconductor substrate 5, which will be described later. The barrier layer 15 is not limited to being formed of those specified materials as long as it serves as described above, and may be made of a single layer or stacked layers. The stacked layers are made of a combination of the materials mentioned above, such as the titanium layer/the titanium nitride layer, for example.

Next, the seed layer 16 is formed on the barrier layer 15, as shown in FIG. 9. The seed layer 16 is a conductive layer that serves as a foundation electrode to form the through-hole electrode 17 and the wiring layer 18 by plating as described below, and composed of a metal such as copper (Cu), ruthenium (Ru) or palladium (Pd). The seed layer 16 is formed by sputtering, PVD, CVD or other film forming method. A thickness of the seed layer 16 is about 50 nm, for example. Since the sidewall of the via hole 12 is flattened, the coverage of the barrier layer 15 and the seed layer 16 is better than that in the conventional art.

Next, the through-hole electrode 17 made of copper and the wiring layer 18 continuously connected with it are formed on the seed layer 16 including the inside of the via hole 12 by electrolytic plating using the seed layer 16 as a plating electrode, as shown in FIG. 9. The through-hole electrode 17 is a conductive layer formed inside the via hole 12. The through-hole electrode 17 and the wiring layer 18 are electrically connected with the pad electrode 7 exposed in the bottom of the via hole 12 through the barrier layer 15 and the seed layer 16. Since the sidewall of the via hole 12 is flattened, the charge convergence seen in the conventional art does not take place and the through-hole electrode 17 and the wiring layer 18 are formed favorably.

Figure 12:
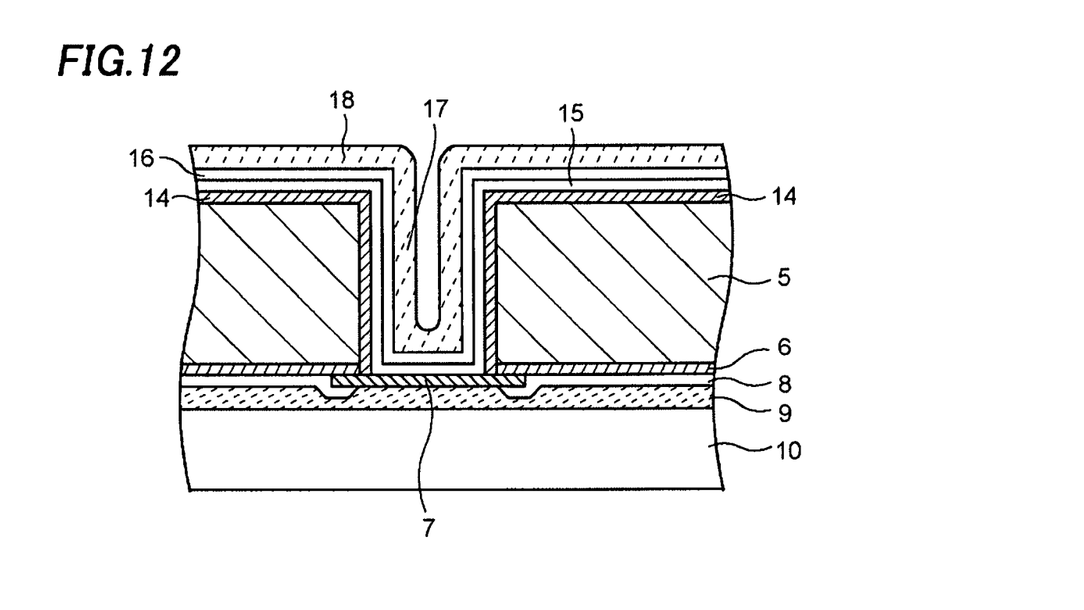
FIG. 12 is a cross-sectional view showing the manufacturing method of the semiconductor device according the second embodiment of this invention.

Note that the through-hole electrode 17 does not necessarily fill the via hole 12 completely, and may fill it incompletely as shown in FIG. 12. With a structure described above, the conductive material needed to form the through-hole electrode 17 and the wiring layer 18 can be saved, while throughput is improved since the through-hole electrode 17 and the wiring layer 18 can be formed in less time compared with the case in which the via hole 12 is filled completely.

Figure 10:
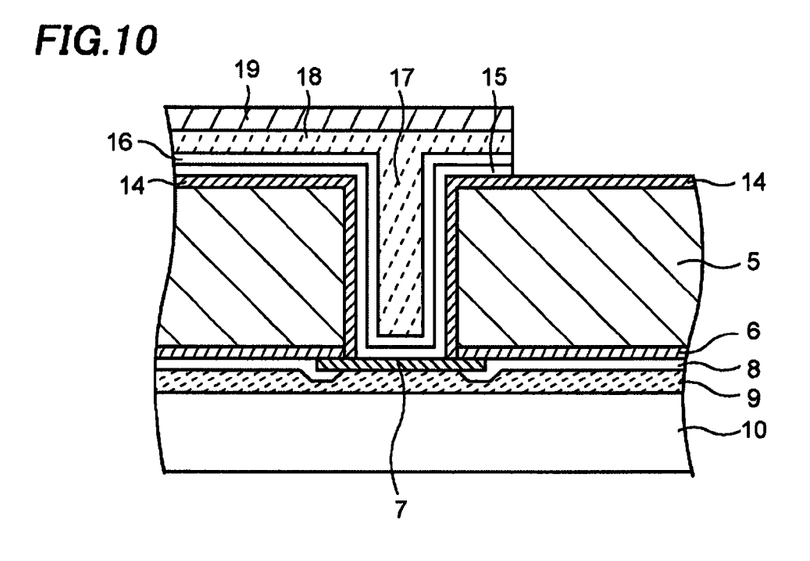
FIG. 10 is a cross-sectional view showing the manufacturing method of the semiconductor device according the second embodiment of this invention.

Next, a photoresist layer 19, that is used to shape the wiring layer 18 into a wiring pattern, is formed selectively on the wiring layer 18 on the back surface of the semiconductor substrate 5, as shown in FIG. 10. Next, unnecessary portions of the wiring layer 18 and the seed layer 16 are removed by etching using the photoresist layer 19 as a mask. The wiring layer 18 is shaped into the predetermined wiring pattern by the etching. Following the above, the barrier layer 15 formed on the back surface of the semiconductor substrate 5 is selectively removed by etching using the wiring layer 18 as a mask.

The barrier layer 15, the seed layer 16, the through-hole electrode 17 and the wiring layer 18 are not limited to be formed as described above. For example, a photoresist layer or the like may be formed in a region on the back surface of the semiconductor substrate 5, where the barrier layer 15 and the wiring layer 18 are not to be formed, and patterning is performed by forming the barrier layer 15, the seed layer 16 and the wiring layer 18 in a region that is not covered with the photoresist layer or the like. The manufacturing process described above does not need the photoresist layer 19.

Figure 11:
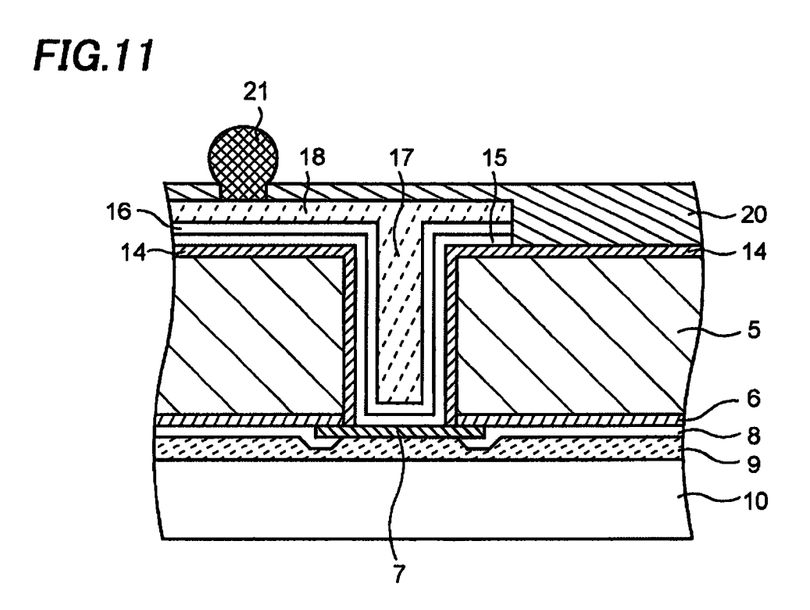
FIG. 11 is a cross-sectional view showing the semiconductor device and its manufacturing method according to the second embodiment of this invention.

Next, a protection layer 20 made of an organic material such as solder resist or an inorganic material such as a silicon nitride film is formed on the back surface of the semiconductor substrate 5, as shown in FIG. 11. An opening is formed in a region of the protection layer 20 where a conductive terminal is to be formed, and an electrode connection layer (not shown) made of nickel (Ni) and gold (Au) is formed on the wiring layer 18 exposed in the opening. After that, a solder is screen-printed on the electrode connection layer and ball-shaped conductive terminal 21 is formed by reflowing the solder by heat treatment.

The conductive terminal 21 may be formed by a so-called dispenser method (a coating method) in which a ball-shaped terminal or the like made of a solder or the like is coated using a dispenser or by electrolytic plating or the like. Also, there is a case of other embodiment, in which the conductive terminal 21 is not formed. In this case, the electrode connection layer or the wiring layer 18 is exposed in the opening in the protection layer 20. And the electrode connection layer or the wiring layer 18 is connected with an electrode of another device.

The supporter 10 may be left bonded to the semiconductor substrate 5, or separated from the semiconductor substrate 5 so that it can be recycled.

With the processing steps described above, there is completed the semiconductor device of a chip size package type in which a wiring from a lower layer conductor (the pad electrode 7) to an upper layer conductor (the wiring layer 18, the conductive terminal 21) provided on the back surface is implemented through the via hole 12. When the semiconductor device is incorporated into electronic equipment, it is electrically connected with an external circuit by mounting the conductive terminal 21 on a wiring pattern on a circuit board.

According to the first and second embodiments, as described above, even when the scallops are caused on the sidewall of the via hole by the Bosch process, they are removed and flattened. As a result, desired film can be stably and homogeneously formed in the via hole 12, making it possible to improve the reliability and the yield of the semiconductor device. Also, since insufficient coverage is less likely to occur, each film on the sidewall of the via hole can be reduced in thickness to improve the productivity.

Although the semiconductor devices are the BGA (Ball Grid Array) type semiconductor devices that have the ball-shaped conductive terminal 21 in the embodiments described above, the embodiments of this invention may be applied to semiconductor devices of other types such as LGA (Land Grid Array) type, CSP (Chip Size Package) type and flip-chip type that have no ball-shaped conductive terminal.

Also, this invention is not limited to the embodiments described above and may be modified within the scope of the invention.

Figure 13:
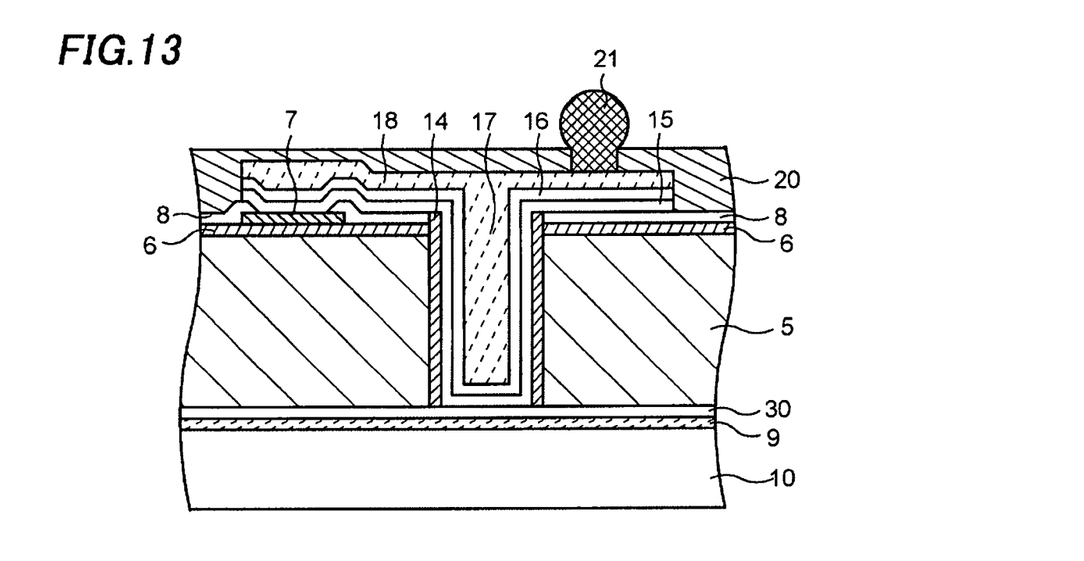
FIG. 13 is a cross-sectional view showing the manufacturing method of the semiconductor device according the second embodiment of this invention.

For example, although the supporter is bonded to the top surface (device side surface) of the semiconductor substrate 5 in the embodiments described above, the supporter 10 may be bonded to the other surface (non-device side surface) as shown in FIG. 13 to manufacture a desired semiconductor device. The pad electrode 7, the wiring 18, the conductive terminal 21 and the like are formed on the top surface (device side surface) of the semiconductor substrate 5 in this semiconductor device. When the semiconductor device is incorporated into electronic equipment, it is electrically connected with an external circuit by mounting the conductive terminal 21 on a wiring pattern on a circuit board. It is also possible that an opening is formed in an insulation film 30 (a silicon oxide film formed by CVD, for example) on the back surface of the semiconductor substrate 5 at a location corresponding to the through-hole electrode 17 after the supporter 10 is separated and removed, and a conductive terminal of another semiconductor device is connected to the opening to implement stacked layers of the semiconductor devices. Note that the same structures in FIG. 13 as those already described above are denoted by the same symbols and explanations on them are omitted. The supporter may be bonded to either surface of the semiconductor substrate as described above. The embodiments of this invention can be broadly applied to semiconductor devices having a via hole.

The manufacturing methods of the semiconductor devices according to the embodiments of this invention reduce scallops generated on the sidewall of via holes formed in a semiconductor device. As a result, it is made possible to form a highly homogeneous film in the via holes in the process steps after the flattening of the inside via hole surfaces.

What is claimed is:

1. A method of manufacturing a semiconductor device, comprising:
    providing a semiconductor substrate comprising a first surface, a second surface opposite from the first surface, an insulation film formed on the first surface and a pad electrode disposed on the insulation film;
    forming a mask layer on the second surface so that an opening is formed in the mask layer at a location corresponding to the pad electrode;
    providing an apparatus configured to perform a Bosch process, which comprises a plasma etching to etch the substrate and a plasma deposition to deposit a protection film that are alternated;
    forming a via hole in the substrate using the mask layer so as to expose the insulation film by performing the Bosch process using the apparatus, a sidewall of the formed via hole having scallops formed by the Bosch process; and
    reducing the scallops formed by the Bosch process on the sidewall of the via hole after the formation of the via hole.

2. The method of claim 1, further comprising removing the mask layer, removing the insulation film to expose the pad electrode at a bottom of the hole, wherein the removing of the mask layer, the removing of the insulation film and the reducing of the scallops are performed simultaneously.

3. The method of claim 1, further comprising forming a conductive layer in the via hole so as to be electrically connected with the pad electrode.

4. The method of claim 1, wherein the reducing of the scallops comprises a dry etching.

5. The method of claim 1, wherein the reducing of the scallops comprises an etching using an etching gas comprising a $CF_4$ gas.

6. The method of claim 1, further comprising removing the insulation film to expose the pad electrode at a bottom of the hole, wherein the removing of the insulation film and the reducing of the scallops are performed simultaneously.

* * * * *